(12) United States Patent
Bowes

(10) Patent No.: US 7,463,367 B2
(45) Date of Patent: Dec. 9, 2008

(54) ESTIMATING OVERLAY ERROR AND OPTICAL ABERRATIONS

(75) Inventor: Steve W. Bowes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 319 days.

(21) Appl. No.: 11/490,890

(22) Filed: Jul. 21, 2006

(65) Prior Publication Data

US 2006/0256322 A1 Nov. 16, 2006

Related U.S. Application Data

(63) Continuation of application No. 10/889,803, filed on Jul. 13, 2004, now Pat. No. 7,180,189.

(51) Int. Cl.
*G01B 11/24* (2006.01)
*G01B 11/30* (2006.01)

(52) U.S. Cl. .............. 356/604; 356/124; 356/635; 356/601; 430/30; 355/53; 355/55

(58) Field of Classification Search ........... 356/125, 356/124, 601, 604, 636; 430/30; 355/53, 355/55
See application file for complete search history.

(56) References Cited

U.S. PATENT DOCUMENTS

| | | | |
|---|---|---|---|
| 5,124,927 A | 6/1992 | Hopewell et al. |
| 5,300,786 A | 4/1994 | Brunner et al. |
| 5,355,306 A | 10/1994 | Waldo |
| 5,365,072 A | 11/1994 | Turner et al. |
| 5,371,774 A | 12/1994 | Cerrina et al. |
| 5,701,013 A | 12/1997 | Hsia et al. |
| 5,712,707 A | 1/1998 | Ausschnitt et al. |
| 5,715,063 A | 2/1998 | Ota |
| 5,757,507 A | 5/1998 | Ausschnitt et al. |
| 5,838,450 A | 11/1998 | McCoy et al. |
| 5,841,520 A | 11/1998 | Taniguchi |
| 5,939,226 A | 8/1999 | Tomimatu |
| 5,966,201 A | 10/1999 | Shiraishi et al. |
| 5,978,085 A | 11/1999 | Smith et al. |
| 6,011,611 A | 1/2000 | Nomura et al. |
| 6,097,473 A | 8/2000 | Ota et al. |
| 6,118,185 A | 9/2000 | Chen et al. |
| 6,137,578 A | 10/2000 | Ausschnitt |

(Continued)

OTHER PUBLICATIONS

Ausschnitt, Christopher P., et al., "Seeing the forest for the trees: a new approach to CD control", *SPIE*, 3332, 212-220.

(Continued)

*Primary Examiner*—L. G Lauchman
(74) *Attorney, Agent, or Firm*—Schwegman, Lundberg & Woessner, P.A.

(57) ABSTRACT

Aberration marks, which may be used in conjunction with lenses in optical photolithography systems, may assist in estimating overlay errors and optical aberrations. Aberration marks may include an inner polygon pattern and an outer polygon pattern, wherein each of the inner and outer polygon patterns include a center, and two sets of lines and spaces having a different feature size and pitch that surround the outer polygon pattern. In some embodiments, the marks can be used with scatterometry or scanning electron microscope devices.

21 Claims, 8 Drawing Sheets

U.S. PATENT DOCUMENTS

| | | | |
|---|---|---|---|
| 6,165,656 | A | 12/2000 | Tomimatu |
| 6,172,740 | B1 | 1/2001 | Suzuki |
| 6,238,851 | B1 | 5/2001 | Nishi |
| 6,317,211 | B1 | 11/2001 | Ausschnitt et al. |
| 6,333,776 | B1 | 12/2001 | Taniguchi |
| 6,356,343 | B1 | 3/2002 | Shiraishi et al. |
| 6,396,569 | B2 | 5/2002 | Zheng et al. |
| 6,407,396 | B1 | 6/2002 | Mih et al. |
| 6,429,930 | B1 | 8/2002 | Littau et al. |
| 6,432,591 | B1 | 8/2002 | Baluswamy et al. |
| 6,436,595 | B1 | 8/2002 | Credendino et al. |
| 6,440,612 | B1 | 8/2002 | Baggenstoss |
| 6,453,457 | B1 | 9/2002 | Pierrat et al. |
| 6,465,141 | B2 | 10/2002 | Boettiger et al. |
| 6,486,956 | B2 | 11/2002 | Byers et al. |
| 6,498,685 | B1 | 12/2002 | Johnson |
| 6,523,162 | B1 | 2/2003 | Agrawal et al. |
| 6,538,830 | B2 | 3/2003 | Boettiger et al. |
| 6,539,521 | B1 | 3/2003 | Pierrat |
| 6,545,829 | B1 | 4/2003 | Boettiger et al. |
| 6,573,015 | B2 * | 6/2003 | Fujimoto .................. 430/30 |
| 6,577,406 | B2 | 6/2003 | Bruce et al. |
| 6,584,609 | B1 | 6/2003 | Pierrat et al. |
| 6,596,448 | B2 | 7/2003 | Lai et al. |
| 6,606,152 | B2 | 8/2003 | Littau et al. |
| 6,617,080 | B1 | 9/2003 | Kawachi |
| 6,625,801 | B1 | 9/2003 | Pierrat |
| 6,699,627 | B2 | 3/2004 | Smith et al. |
| 6,730,444 | B2 | 5/2004 | Bowes |
| 6,744,143 | B1 | 6/2004 | Matsufusa et al. |
| 6,822,342 | B2 | 11/2004 | Baluswamy et al. |
| 2001/0017693 | A1 | 8/2001 | Zheng et al. |
| 2001/0055103 | A1 | 12/2001 | Nishi |
| 2002/0041369 | A1 | 4/2002 | Boettiger et al. |
| 2002/0041373 | A1 | 4/2002 | Littau et al. |
| 2002/0070355 | A1 | 6/2002 | Ota |
| 2002/0085297 | A1 | 7/2002 | Boettiger et al. |
| 2002/0137237 | A1 | 9/2002 | Byers |
| 2002/0137240 | A1 | 9/2002 | Byers et al. |
| 2002/0137303 | A1 | 9/2002 | Byers et al. |
| 2002/0182516 | A1 | 12/2002 | Bowes |
| 2003/0002031 | A1 | 1/2003 | Littau et al. |
| 2003/0002043 | A1 | 1/2003 | Abdulhaim et al. |
| 2003/0021465 | A1 | 1/2003 | Adel et al. |
| 2003/0021466 | A1 | 1/2003 | Adel et al. |
| 2003/0021467 | A1 | 1/2003 | Adel et al. |
| 2003/0026471 | A1 | 2/2003 | Adel et al. |
| 2003/0035090 | A1 | 2/2003 | Imai et al. |
| 2003/0081193 | A1 | 5/2003 | White et al. |
| 2003/0087192 | A1 | 5/2003 | Gau et al. |
| 2003/0090661 | A1 | 5/2003 | Kobayashi |
| 2003/0095267 | A1 | 5/2003 | Mieher et al. |
| 2003/0117599 | A1 | 6/2003 | Takakuwa et al. |
| 2003/0152851 | A1 | 8/2003 | Ideda |
| 2003/0156276 | A1 | 8/2003 | Bowes |
| 2004/0239934 | A1 | 12/2004 | Bowes |

OTHER PUBLICATIONS

Kim, Young C., "Automatic In-situ Focus Monitor Using Line Shortening Effect", *SPIE*, 3677, (1999), 184-193.

* cited by examiner

ESTIMATING OVERLAY ERROR AND OPTICAL ABERRATIONS

This application is a Continuation of U.S. application Ser. No. 10/889,803, filed Jul. 13, 2004 now U.S. Pat. No. 7,180,189 and incorporated herein by reference.

TECHNICAL FIELD

The present disclosure is related to optical photolithography, including the measurement of overlay errors and optical aberrations.

BACKGROUND

The manufacture and fabrication of semiconductor devices involve complex processing steps. During the manufacture of integrated circuits, many layers of different materials are applied to a substrate. These layers overlie one another and must be accurately registered to ensure proper operation of the semiconductor device. If the layers are not properly aligned, the device may not perform well, or may even be inoperative. As semiconductor devices have increased in complexity, the feature dimensions of these devices have decreased, and the influences of optical aberrations become more significant.

To aid in the registration of overlying layers in semiconductor devices, registration patterns, or marks, are included in each layer of the wafer used during fabrication. These patterns have a predetermined relationship when they are correctly registered. A reticle is used to pattern the appropriate marks on a particular wafer process layer, such that the marks can be readily identified by a Registration tool in subsequent processing steps. One example of an alignment mark is a box-in-box mark. An outer box is formed by photolithography, and an inner smaller box is formed in a separate photolithography layering step. When the two boxes are concentric, the layers are accurately registered. Any alignment error produces a displacement of the boxes relative to each other.

Because semiconductor devices are complex and expensive to fabricate, it is desirable to verify registration after the application of each layer. If the displacement of layers is outside of the acceptable limits, defective layers can then be removed and replaced. Registration measurement, verification, and correction is therefore critical to the successful fabrication of these semiconductor devices.

Registration measurement, verification, and correction can be limited by optical aberrations introduced during the photolithography process. Aberration errors are of particular significance given the reduction of sizes of patterns in semiconductor devices. Aberrations affect the ability to accurately measure overlay error. Shift quantity measurements may not correspond to the actual shift quantities.

There are different forms of aberrations that can affect registration verification. Coma aberration exerts the largest influence on the determination of overlay error. Shift of a wave front caused by coma aberration is large at a peripheral portion of a lens and is small at a central portion. Diffracted rays of a large semiconductor pattern are not significantly affected by coma aberration because they have a small diffraction angle and pass through a central region of a lens, causing less wave front aberration. However, a small semiconductor pattern allows passage higher frequency light, which will be more affected by a diffraction phenomenon of a lens. Therefore, the rays diffracted by a small semiconductor pattern have a large diffraction angle, and pass through a peripheral region of a lens, thereby exhibiting more of a coma aberration.

Astigmatism is another optical aberration that occurs because a wave surface in general has double curvature. In this form of aberration, the rays from an object point do not come to a point focus, but rather intersect a set of image planes in a set of ellipses, the diameters of which are proportional to the distances of the two foci from the image plane in consideration.

Spherical aberrations have symmetry of rotation, and are direction-independent. These aberrations occur because rays of different aperture usually do not come to the same focus. These aberrations are also sometimes referred to as aperture aberrations. Spherical aberration occurs in simple refraction at a spherical surface, and is characterized by peripheral and paraxial rays focusing at different points along the axis.

As discussed earlier, semiconductor devices have increased in complexity. The feature dimensions of these devices have decreased, and the influences of overlay errors and optical aberrations have become more significant. It is critical that both overlay errors and optical aberrations be estimated accurately and easily to optimize the critical dimension manufacturing process.

For the reasons stated above, and for other reasons stated below which will become apparent to those skilled in the art upon reading and understanding the present specification, there is a need for improved mechanisms to estimate overlay errors and optical aberrations, such as astigmatism, coma, spherical aberration, and defocus.

BRIEF DESCRIPTION OF THE DRAWINGS

In the following drawings, where the same number reflects similar function in each of the drawings.

DETAILED DESCRIPTION

Figure 1:
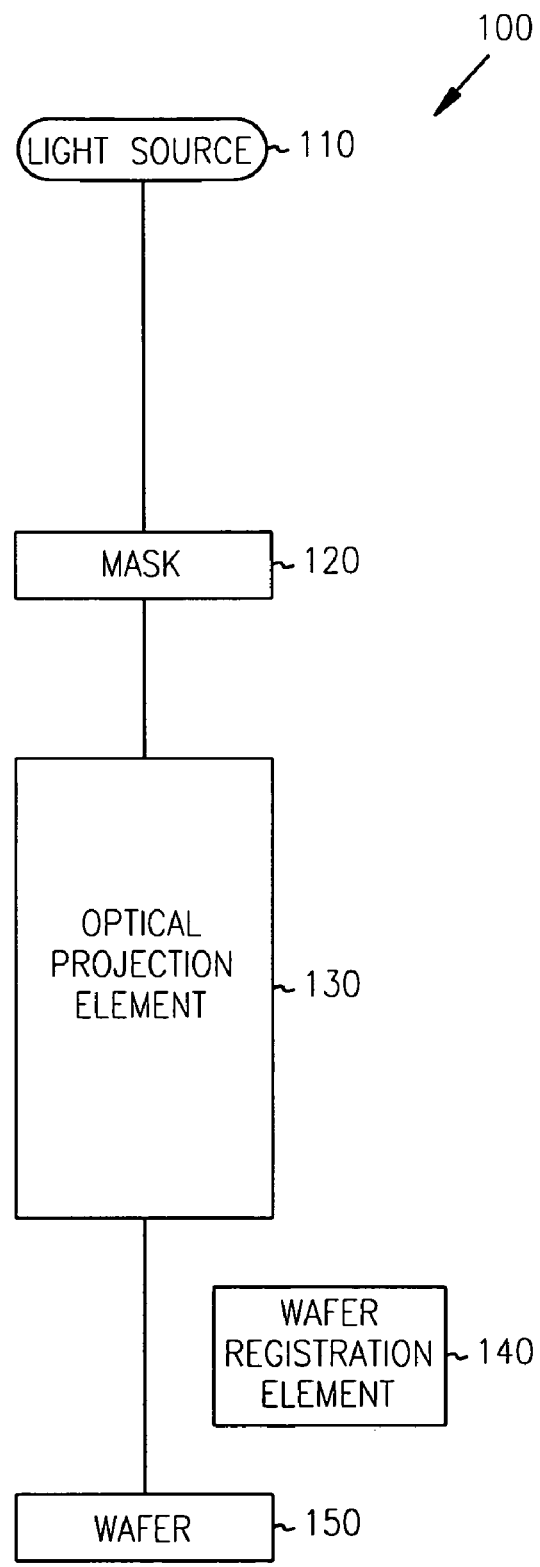
FIG. 1 is a high-level view of various components in an optical photolithography system according to various embodiments of the invention.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Some embodiments of the invention provide an aberration mark for use in an optical photolithography system, and a method for estimating overlay errors and optical aberrations. The aberration mark includes an inner polygon pattern and an outer polygon pattern, wherein each of the inner and outer polygon patterns include a center, and two sets of lines and spaces having a different feature size and pitch that surround the outer polygon pattern. The aberration mark can be used to estimate overlay errors and optical aberrations.

In some embodiments, the inner polygon pattern is a smaller square box shape and the outer polygon pattern is a larger square box shape. In other embodiments, the inner polygon pattern is a smaller octagon shape and the outer polygon pattern is a larger octagon shape.

Some embodiments of the invention provide a method of using an aberration mark during a scatterometry process to estimate optical aberrations, wherein the aberration mark has two schnitzel patterns of different pitch. The method includes shining a laser on the aberration mark at an angle, capturing an image of a scattering of the laser from the two schnitzel patterns, measuring a width of the two schnitzel patterns, estimating a defocus aberration, estimating a coma aberration, estimating a spherical aberration, and estimating an astigmatism aberration.

Yet another aspect of the various embodiments provides a method of using a mark with a scanning electron microscope to estimate overlay errors and optical aberrations, wherein the mark has a box-in-box structure and two schnitzel patterns of different pitch that surround the box-in-box structure. The method includes scanning the mark with an electron beam in a vacuum, capturing an image of ejected electrons from the two schnitzel patterns, measuring a width of the two schnitzel patterns, estimating a displacement of the box-in-box structure, estimating a defocus aberration, estimating a coma aberration, estimating a spherical aberration, and estimating an astigmatism aberration.

Still another aspect of the various embodiments provides a method for monitoring aberrations of a lens in an optical photolithography system. The method includes forming a reticle on a first mask, the reticle having a box-in-box structure and two schnitzel patterns of different pitch that surround the box-in-box structure, forming a first image pattern from the reticle during a first photolithography cycle, the first image pattern having a box-in-box structure and two schnitzel patterns of different pitch that surround the box-in-box structure of the first image pattern, measuring a first line-shortening effect in the two schnitzel patterns of the first image pattern, estimating a baseline set of optical-aberration values of the lens, forming the reticle on a second mask, forming a second image pattern from the reticle during a second photolithography cycle, the second image pattern having a box-in-box structure and two schnitzel patterns of different pitch that surround the box-in-box structure of the second image pattern, measuring a second line-shortening effect in the two schnitzel patterns of the second image pattern, estimating a subsequent set of optical-aberration values of the lens, and comparing the baseline and subsequent set of optical-aberration values of the lens to determine changes.

FIG. 1 is a high-level view of various components in an optical photolithography system used with various embodiments of the present invention. The optical photolithography system shown is just one example of an environment in which the present invention may be practiced. System 100 includes a light source 110, mask 120, optical projection element 130, wafer 150, and wafer registration element 140. Beams of light are emitted from light source 110 and pass through mask 120. Mask 120 can include a reticle. A reticle has only a portion of a complete die pattern. Optical projection element 130 projects and patterns the image from mask 120 onto wafer 150. Wafer registration element 140 verifies the fabrication process and pattern alignment. System 100 patterns wafer 150 from mask 120 and registers wafer 150.

Transferring an image from mask 120 to wafer 150 is a multi-step process. This multi-step process first includes applying photoresist onto wafer 150. Photoresist is a light-sensitive material, such that exposure to light causes changes in its structure and properties. Light source 110, mask 120, optical projection element 130, and wafer 150 must all be precisely aligned, such that emitted rays from light source 110 pass through mask 120. Optical projection element 130 includes one or more lenses that project the rays through mask 120 onto portions of the photoresist layer of wafer 150. Negative resist is polymerized, and those portions of unpolymerized resist are removed. Wafer registration element 140 verifies alignment of multiple patterned layers on wafer 150. Wafer registration element 140 can include a stepper component. After registration, the top layer of wafer 150 is removed, or etched, through an opening in the resist layer, and the rest of the photoresist layer is also removed from the wafer. Wafer 150 has now been patterned with the image from mask 120.

Mask 120 may include a reticle that has registration verification marks that are used and recognized by wafer registration element 140. However, the accuracy the registration process can be limited by optical aberrations introduced by optical projection element 130 that affect the patterning of wafer 150. Optical projection element 130 includes one or more lenses. The one or more lenses of optical projection element 130 can introduce aberrations into the fabrication process.

Figure 2:
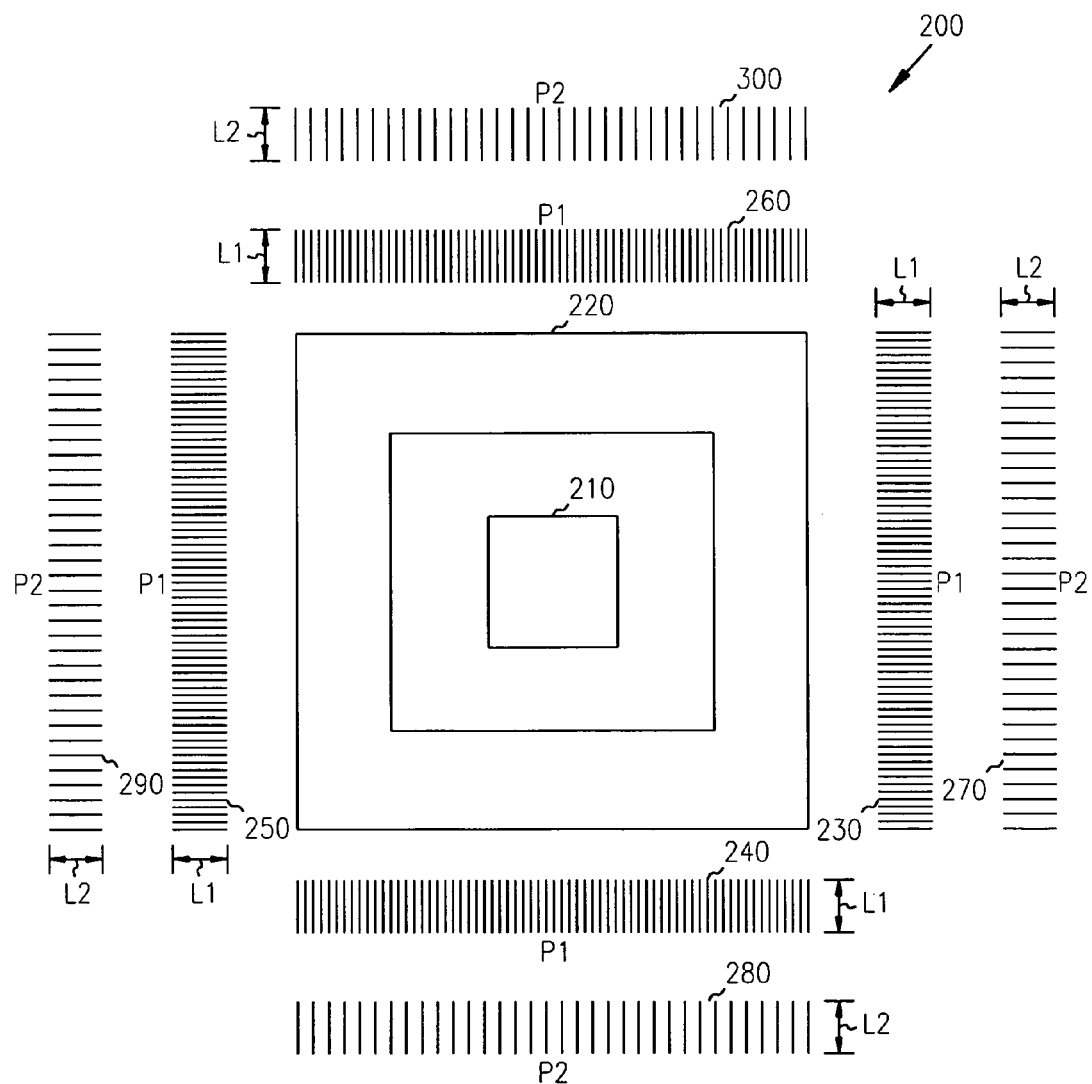
FIG. 2 is a top view of one embodiment of the present invention that illustrates an aberration mark according to one embodiment of the present invention.

FIG. 2 is a top view of one embodiment of the present invention that illustrates an aberration mark according to one embodiment of the present invention. This mark is used both for registration and for estimating aberrations introduced by optical projection element 130, and can be patterned onto wafer 150 from mask 120. Mark 200 includes inner box 210 and outer box 220. Outer box 220 is larger than inner box 210. Outer box 220 has first, second, third, and fourth outer sides. Mark 200 also includes a first and second schnitzel pattern. (The term schnitzel is used in this application to mean an array of lines. A schnitzel pattern can include one or more schnitzels, i.e. arrays of lines.) First schnitzel pattern includes first array 230, second array 240, third array 250, and fourth array 260. First array 230 is separate from and adjacent to the first outer side of outer box 220. First array 230 includes parallel lines of first pitch P1 that run in a direction perpendicular to the first outer side of outer box 220. Each of the lines of first array 230 has a first length L1. Second array 240 is separate from and adjacent to the second outer side of outer box 220. Second array 240 includes parallel lines of first pitch P1 that run in a direction perpendicular to the second outer side of outer box 220. Each of the lines of second array 240 has a first length L1. Third array 250 is separate from and adjacent to the third outer side of outer box 220. Third array 250 includes parallel lines of first pitch P1 that run in a direction perpendicular to the third outer side of outer box 220. Each of the lines of third array 250 has a first length L1. Fourth array 260 is separate from and adjacent to the fourth outer side of outer box 220. Fourth array 260 includes parallel lines of first pitch P1 that run in a direction perpendicular to the fourth outer side of outer box 220. Each of the lines of fourth array 260 has a first length L1.

Second schnitzel pattern includes first array 270, second array 280, third array 290, and fourth array 300. First array 270 is separate from and adjacent to first array 230. First array 270 includes parallel lines of second pitch P2 that run in a direction perpendicular to the first outer side of outer box 220. Each of the lines of first array 270 has a second length L2. Second array 280 is separate from and adjacent to second array 240. Second array 280 includes parallel lines of second pitch P2 that run in a direction perpendicular to the second outer side of outer box 220. Each of the lines of second array 280 has a second length L2. Third array 290 is separate from and adjacent to third array 250. Third array 290 includes parallel lines of second pitch P2 that run in a direction perpendicular to the third outer side of outer box 220. Each of the lines of third array 290 has a second length L2. Fourth array 300 is separate from and adjacent to fourth array 260. Fourth array 300 includes parallel lines of second pitch P2 that run in a direction perpendicular to the fourth outer side of outer box 220. Each of the lines of fourth array 300 has a second length L2.

In one specific embodiment, the first pitch PI of each of the arrays 230, 240, 250, and 260 of the first schnitzel pattern is equal to 0.15 microns. The first length L1 of each of the parallel lines in these arrays is equal to 0.15 microns. The second pitch P2 of each of the arrays 270, 280, 290, and 300 of the second schnitzel pattern is equal to 0.5 microns, and the second length L2 of each of the parallel lines in these arrays is equal to 0.25 microns.

In another specific embodiment, the first length L1 of each of the parallel lines in arrays 230, 240, 250, and 260 of the first schnitzel pattern is equal to an amount in the range of 0.15 to 0.35 microns. Second length L2 of each of the parallel lines in arrays 270, 280, 290, and 300 of the second schnitzel pattern is equal to an amount in the range of 0.15 to 0.35 microns.

Figure 3:
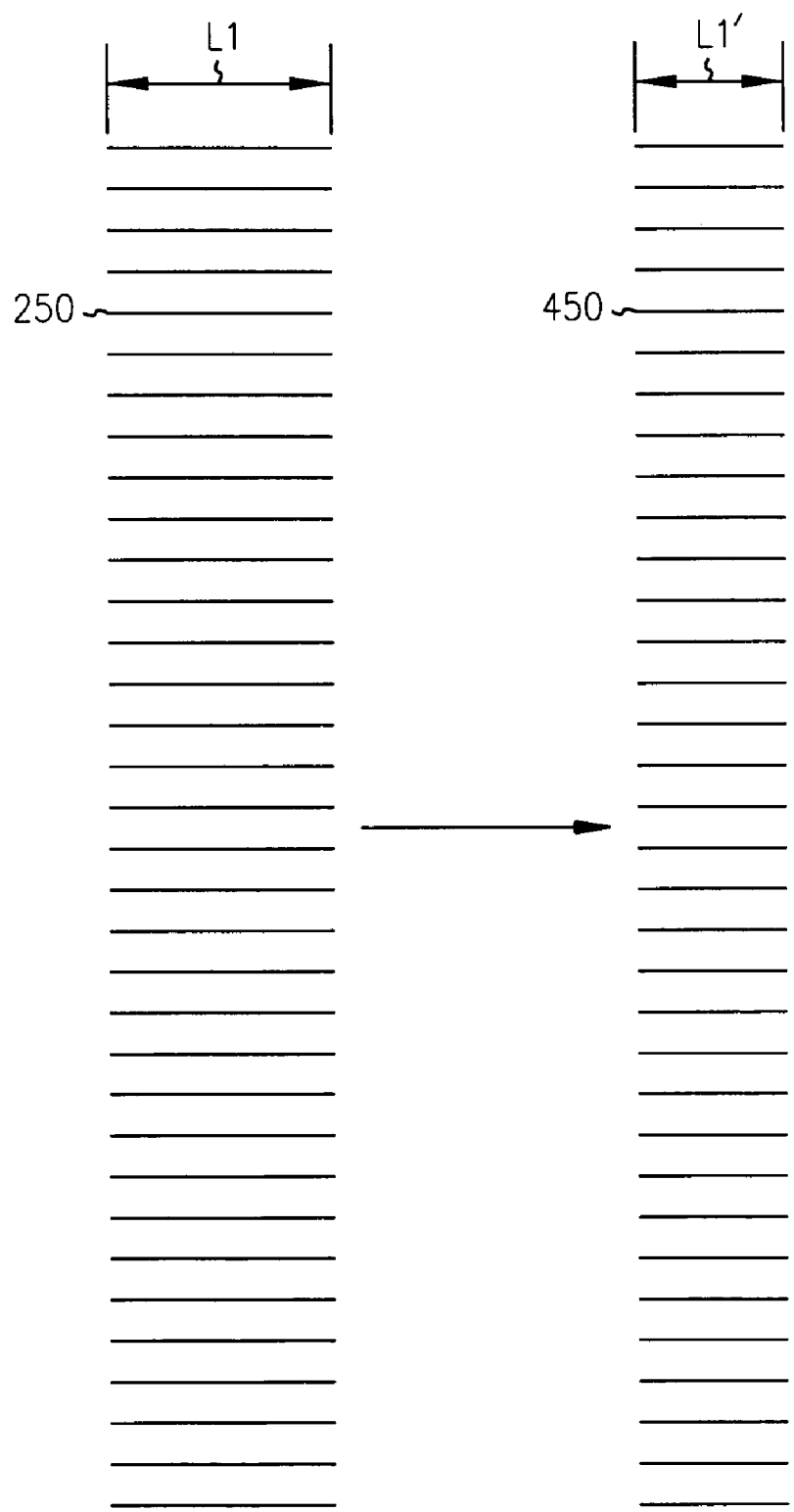
FIG. 3 is an expanded view of one array of parallel lines in the aberration mark that exhibits a line-shortening effect during the photolithography process.

FIG. 3 is an expanded view of one array of parallel lines in the aberration mark that exhibits a line-shortening effect during the semiconductor fabrication process. As an example, third array 250 of the first schnitzel pattern of mark 200 is shown in FIG. 3. Third array 250 has parallel lines each of first length L1. Third array 250 may be on a reticle on mask 120 that is to be patterned onto wafer 150 through optical projection element 130 (shown in FIG. 1). Third array 250 may be patterned onto wafer 150 as third (patterned) array 450 having parallel lines each of length L1'. However, L1 may not be equal to L1'. In fact, in many instances, L1' will be less than L1 due to an effect called line-end shortening. This can also be characterized as a change in the width of third array 250. Line-end shortening effects are caused by optical diffraction during the photolithography process. Optical projection element 130 may cause line-end shortening for the patterning of third (patterned) array 450 onto wafer 150. FIG. 3 only shows this line-shortening effect for third array 250 of mark 200, but this same effect may also cause line-end shortening in first array 230, second array 240, and fourth array 260 of the first schnitzel pattern of mark 200, as well as in first array 270, second array 280, third array 290, and fourth array 300 of the second schnitzel pattern of mark 200. This line-end shortening will have a potential effect on all of the imaged patterns of these arrays on wafer 150. Measurements of the line-end shortening in the patterned images of the arrays of the first and second schnitzel patterns with respect to the inner and outer boxes allows one to calculate estimates of aberrations. Estimations of aberrations with the present invention can be either exact or approximate values depending on the nature of the measurements of the line-end shortening in the patterned images of the arrays of the first and second schnitzel patterns.

Figure 4:
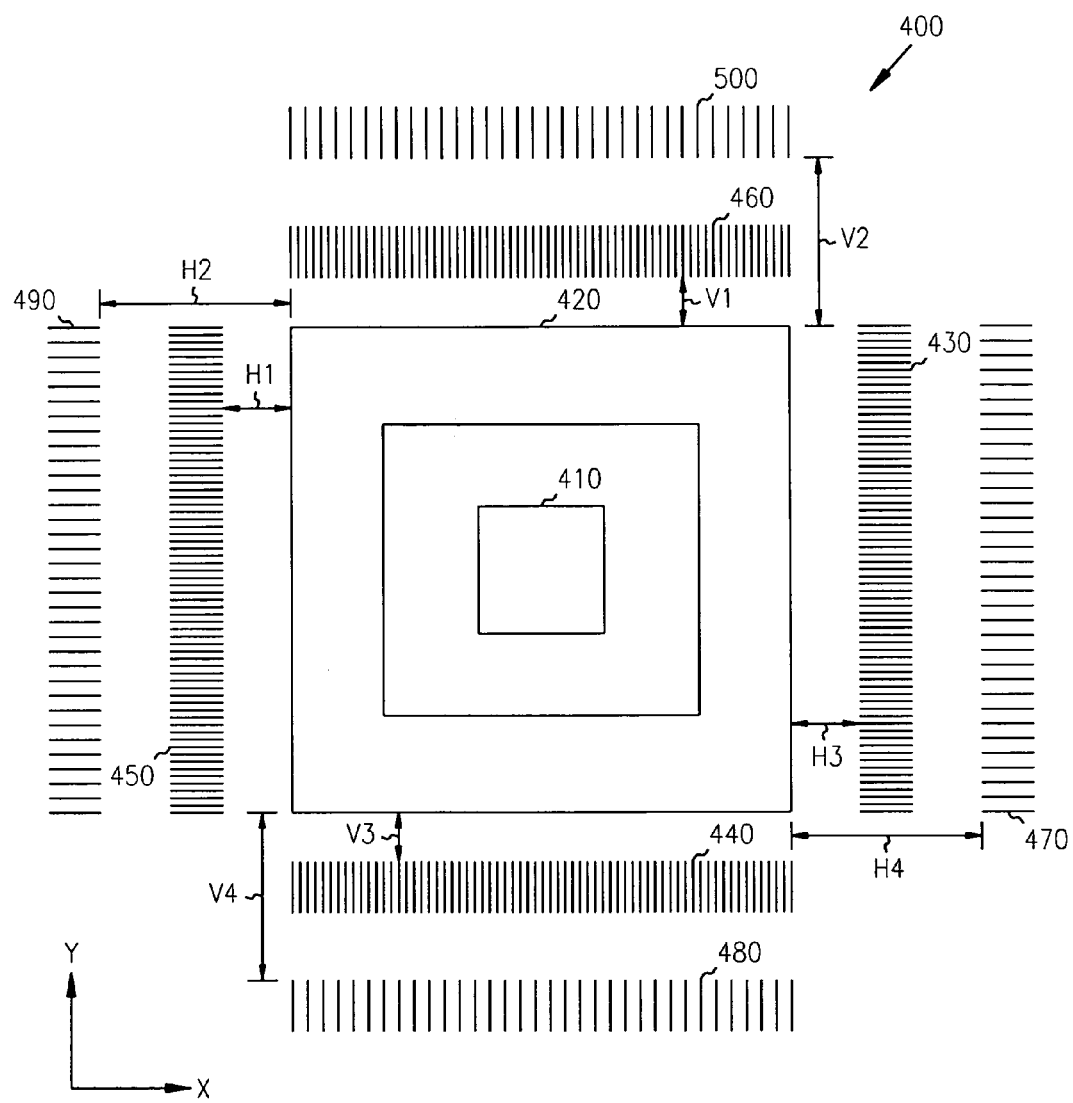
FIG. 4 is a top view of an aberration mark that is formed on a wafer during the photolithography process according to one embodiment of the present invention.

FIG. 4 is a top view of an aberration mark that is formed on a wafer during the semiconductor fabrication process according to one embodiment of the present invention. The aberration mark 200 is patterned onto a wafer to form pattern 400, as shown in FIG. 4. Pattern 400 includes inner box 410 and outer box 420. Outer box 420 is larger than inner box 410. Outer box 420 has first, second, third, and fourth outer sides. Pattern 400 also includes a first and second schnitzel pattern. First schnitzel pattern includes first array 430, second array 440, third array 450, and fourth array 460. First array 430 is separate from and adjacent to the first outer side of outer box 420. First array 430 includes parallel lines that run in a direction perpendicular to the first outer side of outer box 420. Each of the lines of first array 430 may have been subject to a line-shortening effect when patterned during photolithograph. Second array 440 is separate from and adjacent to the second outer side of outer box 420. Second array 440 includes parallel lines that run in a direction perpendicular to the second outer side of outer box 420. Each of the lines of second array 440 may have been subject to a line-shortening effect when patterned during photolithograph. Third array 450 is separate from and adjacent to the third outer side of outer box 420. Third array 450 includes parallel lines that run in a direction perpendicular to the third outer side of outer box 420. Each of the lines of third array 450 may have been subject to a line-shortening effect when patterned during photolithograph. Fourth array 460 is separate from and adjacent to the fourth outer side of outer box 420. Fourth array 460 includes parallel lines that run in a direction perpendicular to the fourth outer side of outer box 420. Each of the lines of fourth array 460 may have been subject to a line-shortening effect when patterned during photolithograph.

Second schnitzel pattern includes first array 470, second array 480, third array 490, and fourth array 500. First array 470 is separate from and adjacent to first array 430. First array 470 includes parallel lines that run in a direction perpendicular to the first outer side of outer box 420. Each of the lines of first array 470 may have been subject to a line-shortening effect when patterned during photolithograph. Second array 480 is separate from and adjacent to second array 440. Second array 480 includes parallel lines that run in a direction perpendicular to the second outer side of outer box 420. Each of the lines of second array 480 may have been subject to a line-shortening effect when patterned during photolithograph. Third array 490 is separate from and adjacent to third array 450. Third array 490 includes parallel lines that run in a direction perpendicular to the third outer side of outer box 420. Each of the lines of third array 490 may have been subject to a line-shortening effect when patterned during photolithograph. Fourth array 500 is separate from and adjacent to fourth array 460. Fourth array 500 includes parallel lines that run in a direction perpendicular to the fourth outer side of outer box 420. Each of the lines of fourth array 500 may have been subject to a line-shortening effect when patterned during photolithograph.

As discussed above, optical aberrations can cause fabrication errors when patterning wafers from the masks during photolithograph. Many of these aberrations are size, critical dimension (CD), and pitch dependent. That is, the aberrations will have more or less of an influence depending on the size, CD, and line pitch for the images that are patterned on the wafers. In particular, the line-shortening effects discussed above may have a noticeable influence on the arrays of parallel lines in any of the embodiments of the aberration mark. The lines often will not be patterned with the same length as they have in the mask, and the line-shortening effect can be measured with respect to the outer box 420 of the patterned image. Measuring such effects will allow calculation of estimates of various aberrations in the lens(es) used during photolithograph.

First array 430 of the first schnitzel pattern is adjacent to the first outer side (right outer side) of outer box 420. The lines of first array 430 may have been shortened due to a line-shortening effect when they were patterned onto the wafer. These lines run in a direction perpendicular to the right outer side of outer box 420, and a horizontal distance H3 can be measured between the right outer side of outer box 420 and a line-end of the lines in first array 430. Horizontal distance H3 is shown in FIG. 4. Second array 440 of the first schnitzel pattern is adjacent to the second outer side (lower outer side) of outer box 420. The lines of second array 440 may have been shortened due to a line-shortening effect when they were patterned onto the wafer. These lines run in a direction perpendicular to the lower outer side of outer box 420, and a vertical distance V3 can be measured between the lower outer side of outer box 420 and a line-end of the lines in second array 440. Third array 450 of the first schnitzel pattern is adjacent to the third outer side (left outer side) of outer box 420. The lines of third array 450 may have been shortened due to a line-shortening effect when they were patterned onto the wafer. These lines run in a direction perpendicular to the left outer side of outer box 420, and a horizontal distance H1 can be measured between the left outer side of outer box 420 and a line-end of the lines in third array 450. Fourth array 460 of the first schnitzel pattern is adjacent to the fourth outer side (upper outer side) of outer box 420. The lines of fourth array 460 may have been shortened due to a line-shortening effect when they were patterned onto the wafer. These lines run in a direction perpendicular to the upper outer side of outer box 420, and a vertical distance V1 can be measured between the upper outer side of outer box 420 and a line-end of the lines in fourth array 460.

First array 470 of the second schnitzel pattern is adjacent to first array 430. The lines of first array 470 may have been shortened due to a line-shortening effect when they were patterned onto the wafer. These lines run in a direction perpendicular to the right outer side of outer box 420, and a horizontal distance H4 can be measured between the right outer side of outer box 420 and a line-end of the lines in first array 470. Horizontal distance H4 is shown in FIG. 4. Second array 480 of the second schnitzel pattern is adjacent to second array 440. The lines of second array 480 may have been shortened due to a line-shortening effect when they were patterned onto the wafer. These lines run in a direction perpendicular to the lower outer side of outer box 420, and a vertical distance V4 can be measured between the lower outer side of outer box 420 and a line-end of the lines in second array 480. Third array 490 of the second schnitzel pattern is adjacent to third array 450. The lines of third array 490 may have been shortened due to a line-shortening effect when they were patterned onto the wafer. These lines run in a direction perpendicular to the left outer side of outer box 420, and a horizontal distance H2 can be measured between the left outer side of outer box 420 and a line-end of the lines in third array 490. Fourth array 500 of the second schnitzel pattern is adjacent to fourth array 460. The lines of fourth array 500 may have been shortened due to a line-shortening effect when they were patterned onto the wafer. These lines run in a direction perpendicular to the upper outer side of outer box 420, and a vertical distance V2 can be measured between the upper outer side of outer box 420 and a line-end of the lines in fourth array 500.

After all of these horizontal distances H1, H2, H3, and H4, and vertical distances V1, V2, V3, and V4 have been measured, the line-shortening effects can be assessed in both the horizontal and vertical directions, and estimations of various aberrations can be calculated. Aberrations such as coma and astigmatism are direction-dependent, while aberrations such as spherical aberration are direction-independent. Aberrations such as coma and spherical aberration are pattern-dependent, whereas astigmatism is not. The standard box-in-box structure allows registration tools to measure overlay error only. Pattern 400 shown in FIG. 4 allows estimation of both overlay error (described in more detail below) and optical aberrations.

To characterize the best focus conditions, a Focus Exposure Matrix (FEM) must be ran for the aberration mark for one embodiment. Here, the mark is run through a matrix of different focus and dose settings on the standard lithography processed to be analyzed. The various measurements H1, H2, H3, H4, and V1, V2, V3, and V4 are taken and plotted versus focus for the different doses. The resulting chart from this will show what value of H1, H2, H3, H4, or V1, V2, V3, and V4 is expected at a particular dose/focus setting.

The first optical aberration that can be estimated with pattern 400 is defocus. Defocus is a measure of the lack of focus on an image through a lens. A lens that is not in focus can cause defocus aberration when patterning an image during photolithography. The line-shortening is a direct result of defocus discussed above. Defocus can be estimated in both the vertical and horizontal directions (or from the average of them both). A first horizontal defocus HF1 can be estimated from the equation (H1+H3)/2. This estimation uses the measurements for H1 and H3 described above for the first schnitzel pattern. H3 measures the line-shortening effect in first array 430, and H1 measures the line-shortening effect in third array 450. HF1 measures the defocus in the horizontal direction using first array 430 and third array 450 of the first schnitzel pattern as reference patterns. A second horizontal defocus HF2 can be estimated from the equation (H2+H4)/2. This estimation uses the measurements for H2 and H4 described above for the second schnitzel pattern. H4 measures the line-shortening effect in first array 470, and H2 measure the line-shortening effect in third array 490. HF2 measures the defocus in the horizontal direction using first array 470 and third array 490 of the second schnitzel pattern as reference patterns. HF1 and HF2 may not be equal, because each is measured from a different set of reference patterns. Estimating both HF1 and HF2 provides a better estimate of the defocus aberration in the horizontal direction with respect to schnitzel patterns of different pitch. Also, by comparing HF1 and HF2, through an FEM, one of ordinary skill in the art can determine and estimate a best focus of the lens in the horizontal direction, given the line-shortening effect of lines of different pitch.

A first vertical defocus VF1 can be estimated from the equation (V1+V3)/2. This estimation uses the measurements for V1 and V3 described above for the first schnitzel pattern. V3 measures the line-shortening effect in second array 440, and V1 measures the line-shortening effect in fourth array 460. VF1 measures the defocus in the vertical direction using second array 440 and fourth array 460 of the first schnitzel pattern as reference patterns. A second vertical defocus VF2 can be estimated from the equation (V2+V4)/2. This estimation uses the measurements for V2 and V4 described above for the second schnitzel pattern. V4 measures the line-shortening effect in second array 480, and V2 measures the line-shortening effect in fourth array 500. VF2 measures the defocus in the vertical direction using second array 480 and fourth array 500 of the second schnitzel pattern as reference patterns. VF1 and VF2 may not be equal, because each is measured from a different set of reference patterns. Estimating both VF1 and VF2 provides a better estimate of the defocus aberration in the vertical direction with respect to schnitzel patterns of different pitch. Also, by comparing VF1 and VF2, one of ordinary skill in the art can determine and estimate a best focus of the lens in the vertical direction, given the line-shortening effect of lines of different pitch.

The next optical aberration that can be estimated with pattern 400 is astigmatism. Astigmatism is another optical aberration that occurs because a wave surface in general has double curvature. In this form of aberration, the rays from an object point do not come to a point focus, but rather intersect a set of image planes in a set of ellipses, the diameters of which are proportional to the distances of the two foci from the image plane in consideration. If an object point is a distance from the optical axis then the cone of rays from that point will strike the lens asymmetrically. Rays that are less parallel to the optical axis will be focused differently from those that are parallel, or almost parallel, to the optical axis.

Astigmatism is an optical aberration that is direction-dependent. It can be estimated as a difference between the best focus in each of the horizontal and vertical directions. As noted above, one of ordinary skill in the art can determine a best focus in the horizontal direction by comparing the values of HF1 and HF2 through an FEM. Also, by comparing VF1 and VF2, through an FEM, one of ordinary skill in the art can determine a best focus in the vertical direction. Astigmatism can then be estimated by determining the difference between the best focus in the horizontal direction and the best focus in the vertical direction.

The next optical aberration that can be estimated with pattern 400 is coma. This can be characterized as a pattern-dependent placement shift. Coma aberration exerts the largest influence on the determination of overlay error. Shift of a wave front caused by coma aberration is large at a peripheral portion of a lens and is small at a central portion. Diffracted rays of a large semiconductor pattern are not significantly affected by coma aberration because they have a small diffraction angle and pass through a central region of a lens, causing less wave front aberration. However, a small semiconductor pattern allows passage higher frequency light, which will be more affected by a diffraction phenomenon of a lens. Therefore, the rays diffracted by a small semiconductor pattern have a large diffraction angle, and pass through a peripheral region of a lens, thereby exhibiting more of a coma aberration.

Coma is also an aberration that is direction-dependent, and it therefore can be estimated in both the vertical and horizontal directions. Coma also can be characterized as a pattern-dependent placement shift, and it therefore is pattern-dependent. Coma will vary depending on the line pitch of the lines in the first and second schnitzel patterns, and therefore only this type of structure, having arrays of lines with different pitch, will allow estimation of coma in this way. A first horizontal coma HC1 can be estimated as the difference between H1 and H3. This estimation uses the measurements for H1 and H3 described above for the first schnitzel pattern. H3 measures the line-shortening effect in first array 430, and H1 measures the line-shortening effect in third array 450. HC1 measures the coma in the horizontal direction using first array 430 and third array 450 of the first schnitzel pattern as reference patterns. A second horizontal coma HC2 can be estimated as the difference between H2 and H4. This estimation uses the measurements for H2 and H4 described above for the second schnitzel pattern. H2 measures the line-shortening effect in third array 490, and H4 measures the line-shortening effect in first array 470. HC2 measures the coma in the horizontal direction using first array 470 and third array 490 of the second schnitzel pattern as reference patterns. HC1 and HC2 may not be equal, because each is measured from a different set of reference patterns. In fact, HC1 and HC2 will be different if the pitch of the lines in the first schnitzel pattern and the lines in the second schnitzel pattern are different, because coma is pattern-dependent. These distinct coma estimations can only be achieved with this type of structure.

A first vertical coma VC1 can be estimated as the difference between V1 and V3. This estimation uses the measurements for V1 and V3 described above for the first schnitzel pattern. V3 measures the line-shortening effect in second array 440, and V1 measures the line-shortening effect in fourth array 460. VC1 measures the coma in the vertical direction using second array 440 and fourth array 460 of the first schnitzel pattern as reference patterns. A second vertical coma VC2 can be estimated as the difference between V2 and V4. This estimation uses the measurements for V2 and V4 described above for the second schnitzel pattern. V2 measures the line-shortening effect in fourth array 500, and V4 measures the line-shortening effect in second array 480. VC2 measures the coma in the vertical direction using fourth array 500 and second array 480 of the second schnitzel pattern as reference patterns. VC1 and VC2 may not be equal, because each is measured from a different set of reference patterns. In fact, VC1 and VC2 will be different if the pitch of the lines in the first schnitzel pattern and the lines in the second schnitzel pattern are different, because coma is pattern-dependent. These distinct coma estimations can only be achieved with this type of structure. So, as way of an example, if neither HC1 nor HC2 is substantially equal to zero, then there is coma in the horizontal direction.

The next optical aberration that can be estimated with pattern 400 is spherical aberration. This can be characterized as a pattern-dependent focus shift. Spherical aberrations have symmetry of rotation. These aberrations occur because rays of different aperture usually do not come to the same focus. These aberrations are also sometimes referred to as aperture aberrations. Spherical aberration occurs in simple refraction at a spherical surface, and is characterized by peripheral and paraxial rays focusing at different points along the axis. The focal length of the lens will vary depending on the distance from the center of the lens. The effect is that a parallel ray of light entering the lens near the center will be focused less or more than a parallel ray entering near the edges of the lens.

Spherical aberration is direction-independent, and it therefore can be estimated in either the vertical and horizontal directions. Spherical aberration also can be characterized as a pattern-dependent focus shift, and it therefore is pattern-dependent. It can be estimated as a difference between the focus in either of the horizontal or vertical directions. Thus, spherical aberration may be first estimated as the difference between HF1 and HF2. Spherical aberration may also be estimated as the difference between VF1 and VF2. Spherical aberration may be used to help estimate the best focus of the lens in the photolithography system. Because spherical aberration characterizes a pattern-dependent focus shift, and because both of either HF1 and HF2 or VF1 and VF2 are required in its estimation, spherical aberration can only be measured with an embodiment of the aberration mark of the current invention, having arrays of lines in the first schnitzel pattern of first pitch P1, and arrays of lines in the second schnitzel pattern of second pitch P2. The difference in pitch creates a different line-shortening effect in the first and second schnitzel patterns, and creates a pattern-dependent focus shift that can then be estimated.

In some embodiments of the invention, the first, second, third, and fourth arrays of the first schnitzel pattern may not be equally spaced from the first, second, third, and fourth outer sides of the outer box in the mark that is placed on the mask (i.e. there may be inner offsets). In addition, the first, second, third, and fourth arrays of the second schnitzel pattern may not be equally spaced from the first, second, third, and fourth arrays of the first schnitzel pattern in the mark (i.e. there may be outer offsets). When the mark is image patterned onto the wafer during fabrication, overlay error and optical aberrations can be measured in a similar fashion to the method outlined above. However, all distance measurements between the outer sides of the outer box and the arrays of the first and second schnitzel patterns must be made relative to the inner and outer offsets noted above.

Figure 5:
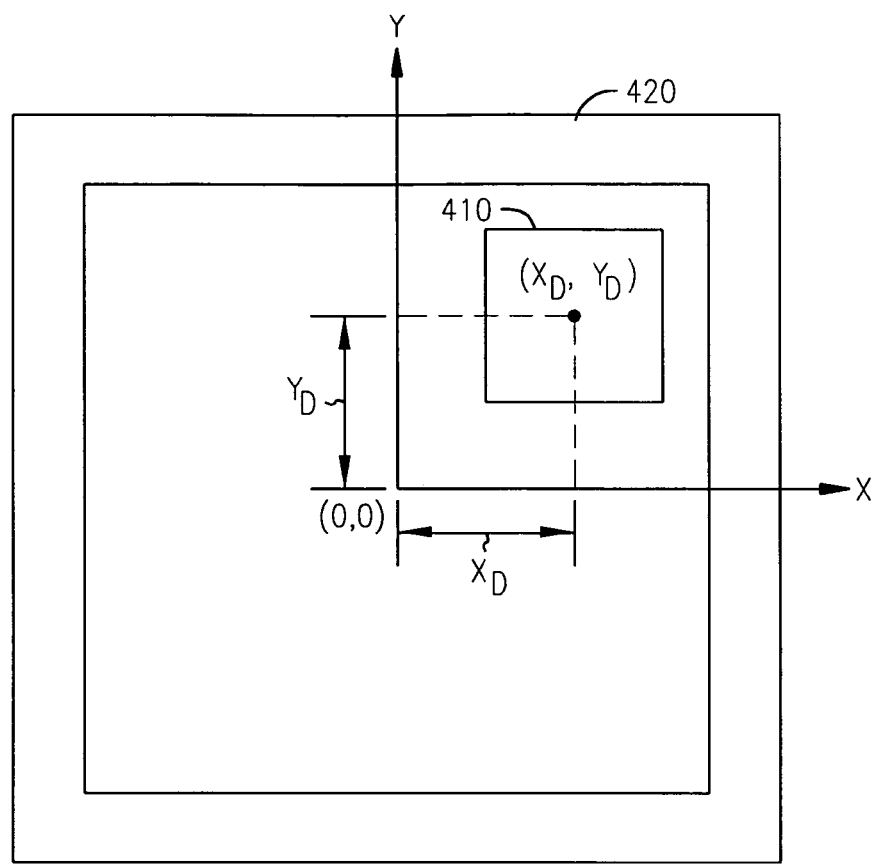
FIG. 5 is an expanded view of a displacement in a box-in-box component of an embodiment of the aberration mark.

FIG. 5 is an expanded view of a displacement in a box-in-box component of an embodiment of the aberration mark. FIG. 5 shows outer box 420 and inner box 410 as a box-in-box structure of pattern 400. FIG. 5 does not show either the first or second schnitzel patterns of pattern 400. FIG. 5 shows an off-center displacement between outer box 420 and inner box 410, characterized as a translational-displacement error, in both the horizontal and vertical directions. In one embodiment of the invention, a displacement between the centers of the outer box and inner box is selected to be zero in the reticle, absent any misalignment induced by process fabrication steps. However, process fabrication can introduce displacement error in either or both of the horizontal and vertical directions when the image is patterned, such that the center of the outer box is no longer equal to the center of the inner box. The displacement can be measured to estimate overlay error, and can be determined with reference to respective, orthogonal, and intersecting X and Y axes defined as lying in the plane. The intersection of the X and Y axes may define an x, y coordinate (0,0), which can be used as a reference point in measuring displacement. FIG. 5 shows both a horizontal and vertical displacement of inner box 410 with respect to outer box 420. The center of inner box 410 has a vertical displacement of $Y_D$ with respect to the center of outer box 420, and has a horizontal displacement of $X_D$ with respect to the center of outer box 420. These vertical and horizontal displacements are the translational-displacement error.

In another embodiment, the displacement between the centers of the outer box and inner box in a reticle is pre-selected to be of a known non-zero magnitude and a known direction, absent any misalignment induced by process fabrication steps. Any displacement between the centers of the outer box and the inner box in the imaged pattern must be measured relative to this pre-selected known offset.

Figure 6:
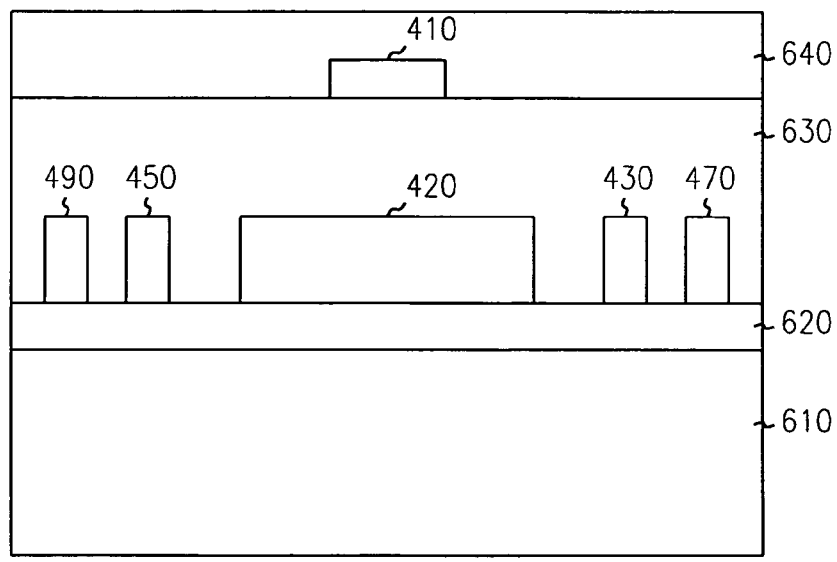
FIG. 6 is a side view of an embodiment of the aberration mark shown in FIG. 4.

FIG. 6 is a side view of an embodiment of an embodiment of the aberration mark shown in FIG. 4. Pattern 400 is imaged onto a wafer, and the various layers are shown in FIG. 6. In this embodiment, substrate 610 is a base layer of the wafer. First layer 620 overlies substrate 610 and is an insulator layer. Second layer 630 overlies first layer 620 and includes outer box 420, first array 430 of the first schnitzel pattern, first array 470 of the second schnitzel pattern, third array 450 of the first schnitzel pattern, and third array 490 of the second schnitzel pattern. Third layer 640 overlies layer 630, and includes inner box 410. FIG. 6 shows only one embodiment of the patterned image of the aberration mark on a wafer. Other embodiments may also implement this structure. For example, there may be fewer or additional intermediary layers. Other embodiments may include inner box 410 being formed on a lower layer than outer box 420. FIG. 6 is not intended to limit the structure of the layers formed on the wafer.

Figure 7:
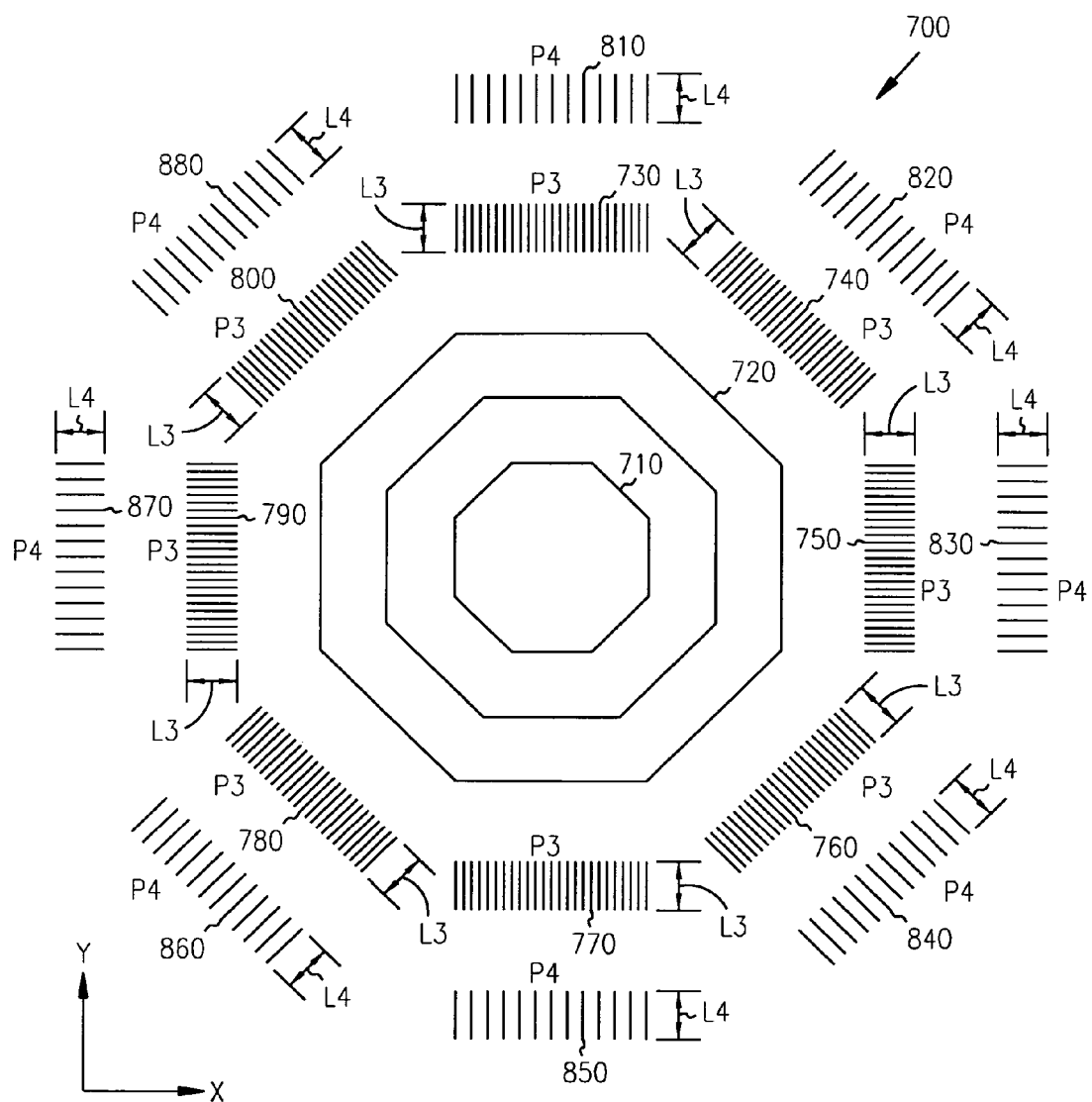
FIG. 7 is a top view of another embodiment of the present invention that illustrates an aberration mark in the shape of an octagon.

FIG. 7 is a top view of another embodiment of the present invention that illustrates an aberration mark in the shape of an octagon. Mark 700 includes inner octagon 710 and outer octagon 720. Outer octagon 720 has first, second, third, fourth, fifth, sixth, seventh, and eighth outer sides. Mark 700 also includes a first and a second schnitzel pattern. First schnitzel pattern includes first array 730, second array 740, third array 750, fourth array 760, fifth array 770, sixth array 780, seventh array 790, and eighth array 800. Second schnitzel pattern includes first array 810, second array 820, third array 830, fourth array 840, fifth array 850, sixth array 860, seventh array 870, and eighth array 880.

In the first schnitzel pattern, first array 730 is separate from and adjacent to the first outer side of outer octagon 720. First array 730 includes parallel lines of first pitch P3 that run in a direction perpendicular to the first outer side of outer octagon 720. Each of the lines of first array 730 has a first length L3. Second array 740 is separate from and adjacent to the second outer side of outer octagon 720. Second array 740 includes parallel lines of first pitch P3 that run in a direction perpendicular to the second outer side of outer octagon 720. Each of the lines of second array 740 has a first length L3. Third array 750 is separate from and adjacent to the third outer side of outer octagon 720. Third array 750 includes parallel lines of first pitch P3 that run in a direction perpendicular to the third outer side of outer octagon 720. Each of the lines of third array 750 has a first length L3. Fourth array 760 is separate from and adjacent to the fourth outer side of outer octagon 720. Fourth array 760 includes parallel lines of first pitch P3 that run in a direction perpendicular to the fourth outer side of outer octagon 720. Each of the lines of fourth array 760 has a first length L3. Fifth array 770 is separate from and adjacent to the fifth outer side of outer octagon 720. Fifth array 770 includes parallel lines of first pitch P3 that run in a direction perpendicular to the fifth outer side of outer octagon 720. Each of the lines of fifth array 770 has a first length L3. Sixth array 780 is separate from and adjacent to the sixth outer side of outer octagon 720. Sixth array 780 includes parallel lines of first pitch P3 that run in a direction perpendicular to the sixth outer side of outer octagon 720. Each of the lines of sixth array 780 has a first length L3. Seventh array 790 is separate from and adjacent to the seventh outer side of outer octagon 720. Seventh array 790 includes parallel lines of first pitch P3 that run in a direction perpendicular to the seventh outer side of outer octagon 720. Each of the lines of seventh array 790 has a first length L3. Eighth array 800 is separate from and adjacent to the eighth outer side of outer octagon 720. Eighth array 800 includes parallel lines of first pitch P3 that run in a direction perpendicular to the eighth outer side of outer octagon 720. Each of the lines of eighth array 800 has a first length L3.

In the second schnitzel pattern, first array 810 is separate from and adjacent to first array 730 of the first schnitzel pattern. First array 810 includes parallel lines of second pitch P4 that run in a direction perpendicular to the first outer side of outer octagon 720. Each of the lines of first array 810 has a second length L4. Second array 820 is separate from and adjacent to second array 740 of the first schnitzel pattern. Second array 820 includes parallel lines of second pitch P4 that run in a direction perpendicular to the second outer side of outer octagon 720. Each of the lines of second array 820 has a second length L4. Third array 830 is separate from and adjacent to third array 750 of the first schnitzel pattern. Third array 830 includes parallel lines of second pitch P4 that run in a direction perpendicular to the third outer side of outer octagon 720. Each of the lines of third array 830 has a second length L4. Fourth array 840 is separate from and adjacent to fourth array 760 of the first schnitzel pattern. Fourth array 840 includes parallel lines of second pitch P4 that run in a direction perpendicular to the fourth outer side of outer octagon 720. Each of the lines of fourth array 840 has a second length L4. Fifth array 850 is separate from and adjacent to fifth array 770 of the first schnitzel pattern. Fifth array 850 includes parallel lines of second pitch P4 that run in a direction perpendicular to the fifth outer side of outer octagon 720. Each of the lines of fifth array 850 has a second length L4. Sixth array 860 is separate from and adjacent to sixth array 780 of the first schnitzel pattern. Sixth array 860 includes parallel lines of second pitch P4 that run in a direction perpendicular to the sixth outer side of outer octagon 720. Each of the lines of sixth array 860 has a second length L4. Seventh array 870 is separate from and adjacent to seventh array 790 of the first schnitzel pattern. Seventh array 870 includes parallel lines of second pitch P4 that run in a direction perpendicular to the seventh outer side of outer octagon 720. Each of the lines of seventh array 870 has a second length L4. Eighth array 880 is separate from and adjacent to eighth array 800 of the first schnitzel pattern. Eighth array 880 includes parallel lines of second pitch P4 that run in a direction perpendicular to the eighth outer side of outer octagon 720. Each of the lines of eighth array 880 has a second length L4.

Mark 700 has characteristics of an octagon and can also be used to pattern an image onto a wafer during photolithography. The imaged pattern can then be used to estimate overlay error and optical aberrations in a way similar to that outlined above. However, the shape of outer octagon 720, and the octagon shape of the arrays of the first and second schnitzel patterns allow one to estimate some of the aberrations in angles of +/−45 degrees, in addition to the horizontal and vertical directions. For example, those aberrations that are direction-dependent, such as coma and astigmatism, can be measured in the horizontal and vertical directions, and also in the directions of +/−45 degrees. Measurements like this can be made because the first and second schnitzel patterns, and the outer sides of outer octagon 720, run in directions of horizontal, vertical, and +/−45 degrees. These additional measurements would improve the calculated estimations of the directionally dependent aberrations.

In other embodiments of the present invention, a mark is a registration structure used in calibrating an optical lithographic measurement system. The registration structure includes one or more calibration structures. Each calibration structure is included on a mask, and can be patterned onto a wafer during photolithography. Each calibration structure includes an inner polygon pattern and an outer polygon pattern. Each of the inner and outer polygon patterns has a center and a plurality of outer sides. Two sets of lines and spaces having a different feature size and pitch surround each outer side of the outer polygon pattern. The displacement between the inner polygon pattern and the outer polygon pattern is of a pre-selected value. This registration structure can be used to estimate both overlay error as well as optical aberrations. Aberrations that are direction-dependent can be estimated in the directions of all the angles of the respective sides of the outer polygon pattern.

In another embodiment, the aberration mark of the present invention is used in the scatterometry process to estimate optical aberrations. The aberration mark includes two schnitzel patterns of different pitch. The mark is patterned onto a wafer, and scatterometry metrology tests and evaluates the wafer during the fabrication process. Accuracy in optical systems is typically limited by the wavelength of the light used, such that surface features on the wafer smaller than the wavelength cannot be detected. However, with scatterometry, a scattered beam can give information about surface features smaller than the wavelength. A laser scans the surface of the wafer, and laser beams are scattered from the surface onto a screen. A camera then captures the screen image and reconstructs the surface. Scatterometry has the potential of measuring grain sizes, contours, and critical dimensions (CDs). In this embodiment of the invention, a laser scans the wafer at an angle. The wafer contains the patterned aberration mark. The laser beams are scattered from the surface and an image is captured. The width of the two schnitzel patterns are measured to calculate the line-shortening effects. Estimates then can be made of optical aberrations such as defocus, coma, spherical aberration, and astigmatism.

In yet another embodiment, the aberration mark of the present invention is used by a scanning electron microscope (SEM) to estimate optical aberrations. The aberration mark includes a box-in-box structure and two schnitzel patterns of different pitch that surround the box-in-box structure. The mark is patterned onto a wafer, and an SEM tests and evaluates the wafer during the fabrication process. Conventional microscopes are often limited in their ability to provide accurate data when evaluating the wafer surface. Their resolving power is limited by the wavelength of the light source used. Depth of field is another limitation. In a conventional microscope, the depth of field decreases as the magnification of the system is increased. Magnification in conventional microscopes is another limiting factor. All of these limitations are overcome by using an SEM to evaluate a wafer. In an SEM, the illumination source is an electron beam that scans over the wafer surface. Secondary electrons are ejected from the surface and are collected and translated into an image of the surface. Both the wafer and the beam of electrons are in a vacuum. In this embodiment of the invention, an electron beam of the SEM is used to scan the wafer surface in a vacuum. The wafer contains the patterned mark. An image of ejected electrons from the schnitzel patterns on the mark are captured, so that the width of the two schnitzel patterns of different pitch can be measured to calculate the line-shortening effects. The measurements with the SEM can then be used to estimate overlay errors and optical aberrations. A displacement of the box-in-box structure of the pattern estimates overlay error. The optical aberrations that can be estimated include defocus, coma, spherical aberration, and astigmatism.

In yet another embodiment of the present invention, aberrations of a lens in an optical photolithography system can be monitored over time. In this embodiment, a reticle is formed on a mask. The reticle includes an aberration mark that has a box-in-box structure surrounded by two schnitzel patterns of different pitch. The reticle on the mask is patterned onto a wafer during a photolithography process. The line-shortening effect in the two schnitzel patterns are then measured, so that estimates can be made of optical aberration values of the lens used for photolithography. (In fact, one or more lenses can be used during photolithography, but reference will be made only to a single lens for simplicity). Some of the optical aberrations of the lens that can be estimated include defocus, coma, spherical aberration, and astigmatism. These estimates provide a set of baseline estimates, or aberration fingerprints, of the lens. The quality of a lens can change over time. By monitoring the quality of the lens, one skilled in the art can best determine if the lens must be modified or replaced during a photolithography cycle. This can be done by making subsequent aberration estimates of the lens and comparing them to the set of baseline estimates. The reticle having the aberration mark is formed on another mask. The reticle on this mask is patterned onto another wafer, such that the line-shortening effect of the two schnitzel patterns can be measured. Another set of estimates then can be made of the optical aberrations of the lens. These aberrations again can include defocus, coma, spherical aberration, and astigmatism. These second set of estimates can be compared to the set of baseline estimates to determine if any of the values have changed. Certain aberrations may have become more predominant or noticeable over time. One of skill in the art can monitor the photolithography lens over time to compare aberration estimates with the set of baseline estimate and determine if any changes need to be made to the photolithography process.

Figure 8:
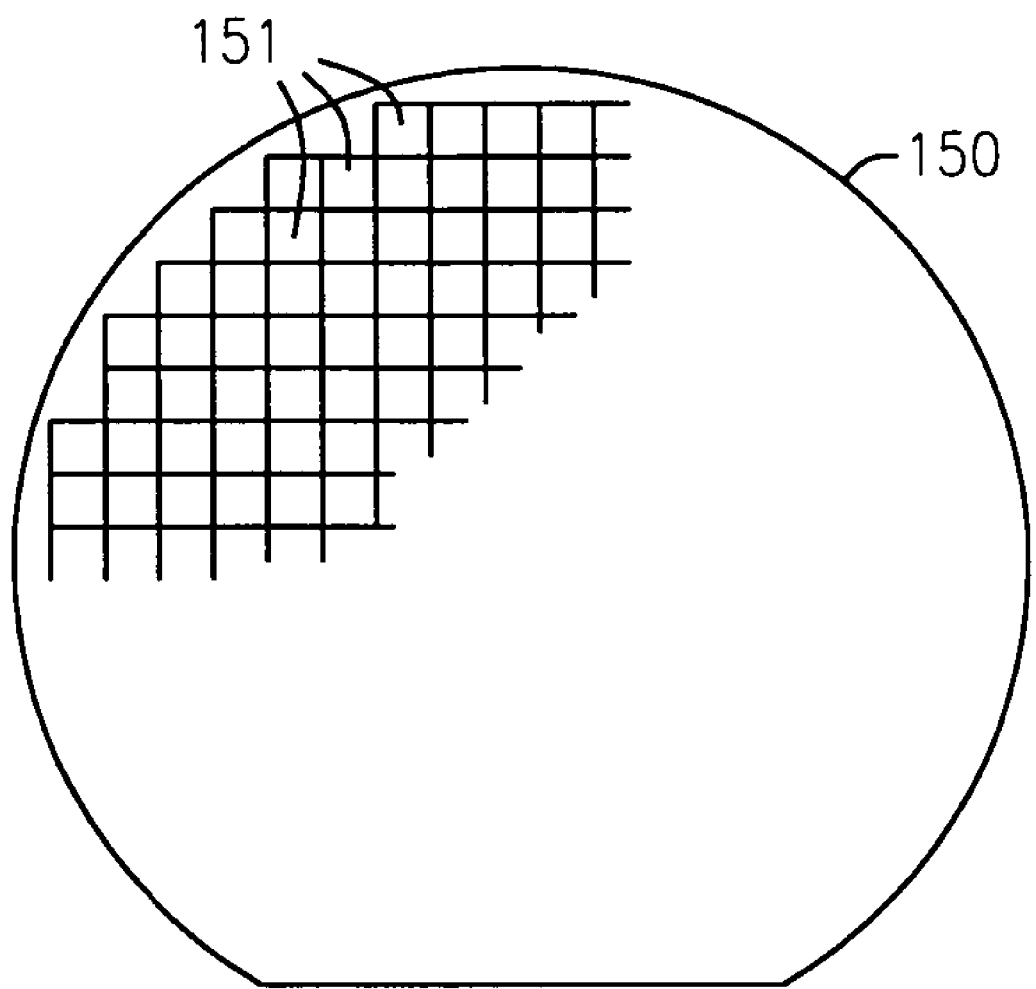
FIG. 8 is a perspective view of a wafer and die pattern that includes an embodiment of the aberration mark.

FIG. 8 is a perspective view of a wafer and die pattern that includes an aberration mark of some embodiments of the present invention. Wafer 150 includes die pattern 151. In one embodiment, wafer 150 includes one or more marks of the present invention. In another embodiment, die pattern 151 is divided into individual chips, as is well-known in the art. These chips can include one or more integrated circuits. An individual chip can also include the mark of the present invention.

Figure 9:
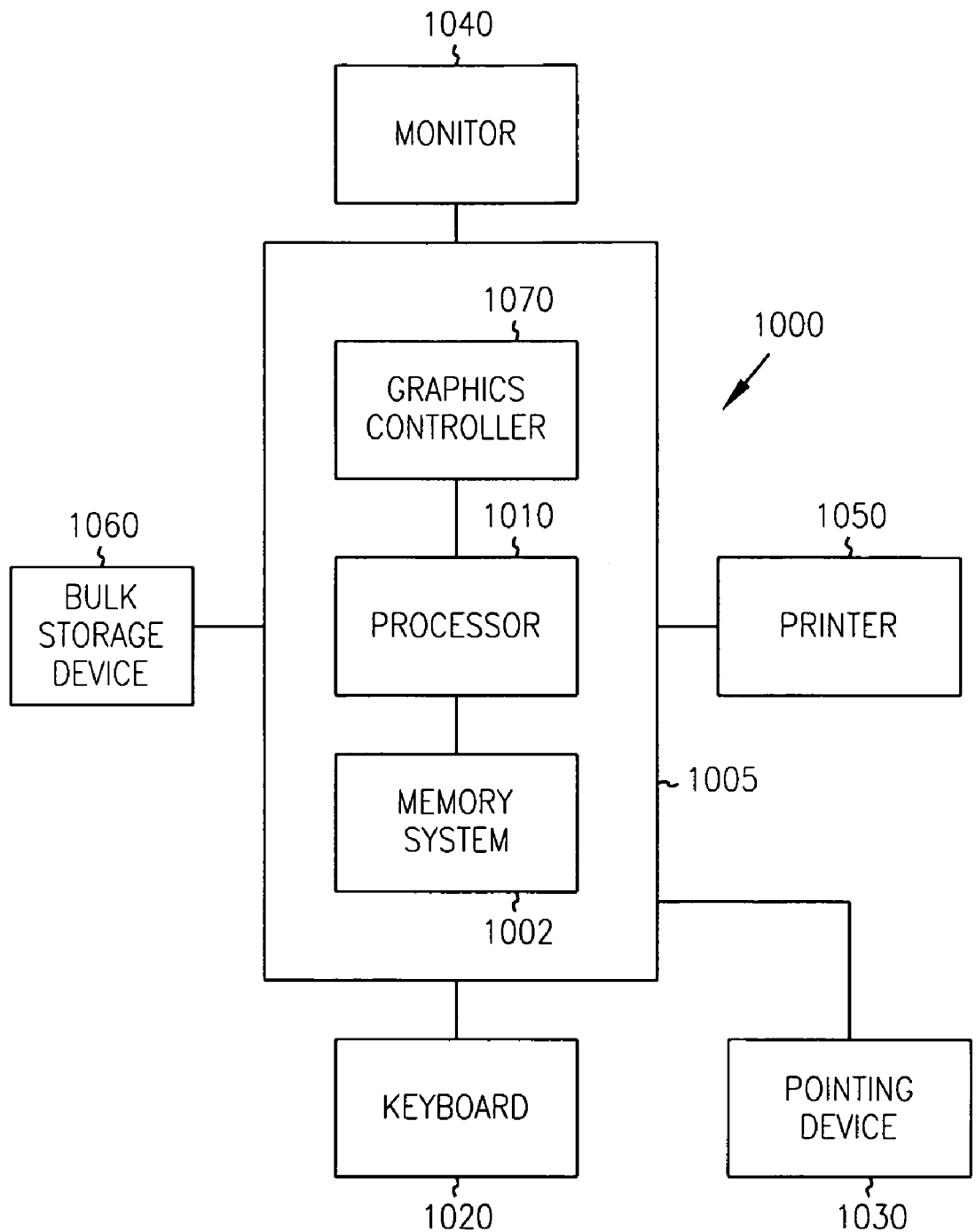
FIG. 9 is a block-diagram view of a computer system implementing an embodiment of the aberration mark.

FIG. 9 is a block-diagram view of a computer system implementing an aberration mark of some embodiments of the present invention. In this embodiment, computer system 1000 contains a processor 1010 and a memory system 1002 housed in a computer unit 1005. The memory system 1002 includes the aberration mark of the present invention. Processor 1010 may also include the mark of the present invention. Computer system 1000 optionally contains user-interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory system.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A photolithographic process, comprising:
   shining laser light onto a first array pattern of parallel lines where each line of the first array have a first pitch;
   capturing a first image of a scattering of the laser light from the first array pattern;
   measuring a first width of the first array of the first image;
   shining the laser light onto a second array pattern of parallel lines where each line of the second array have a second pitch;
   capturing a second image of a scattering of the laser light from the second array pattern;
   measuring a second width of the second array of the second image;
   comparing the first width to the second width; and
   determining an optical aberration from the comparing.

2. The method of claim 1 wherein the determining an optical aberration is included as part of at least one process of estimating a defocus aberration, a coma aberration, a spherical aberration, a displacement aberration, and an astigmatism aberration.

3. The method of claim 1 wherein the comparing the first and second width results in at least one of a defocus aberration, a coma aberration, a spherical aberration, a displacement aberration, and an astigmatism aberration.

4. The method of claim 1 wherein the determining is included as a part of at least one process of estimating overlay error, estimating optical aberrations, estimating aberrations in a scatterometry process, measuring overly errors, measuring optical aberrations, calibrating an optical photolithography measurement system, calibrating a semiconductor manufacturing system, registering overlay, registering optical aberrations, and monitoring aberrations of a lens in an optical photolithography system.

5. The method of claim 1 wherein the measuring the first width and measuring the second width include measuring the line-shortening effect in the first array pattern and second array pattern.

6. A photolithographic process, comprising:
   providing a first pattern of parallel lines having a first pitch;
   providing a second pattern of parallel lines having a different pitch than the first pitch;
   shining a laser light at an angle onto the first pattern and the second pattern;
   measuring and comparing the line-shortening effect on the first pattern and on the second pattern; and
   estimating an optical aberration from the differences in the line-shortening effects.

7. The method of claim 6 wherein the estimating an optical aberration includes estimating at least one of a defocus aberration, a coma aberration, a spherical aberration, a displacement aberration, and an astigmatism aberration.

8. A photolithographic process, comprising:
   providing a box-in-box polygon pattern;
   providing a first pattern of parallel lines adjacent to the polygon pattern, the parallel lines of the first pattern having a first pitch, the parallel lines of the first pattern having a same first line length wherein the length of the parallel lines of the first pattern determines a known width of the first pattern;
   providing a second pattern of parallel lines also adjacent to the polygon pattern, the parallel lines of the second pattern having a second pitch, the parallel lines of the second pattern having a same second line length wherein the length of the parallel lines of the second pattern determines a known width of the second pattern;

illuminating the first pattern and the second pattern;

measuring and comparing the line-shortening effects on the first pattern and on the second pattern; and estimating an optical aberration from the differences in the line-shortening effects.

9. The method of claim 8 wherein illuminating includes illuminating with laser light.

10. The method of claim 8 wherein illuminating includes illuminating with an electron beam.

11. A photolithographic process, comprising:

providing a box-in-box polygon pattern;

providing a first pattern of parallel lines adjacent to the polygon pattern, the parallel lines of the first pattern having a first pitch, the parallel lines of the first pattern having a same first line length wherein the length of the parallel lines of the first pattern determines a known width of the first pattern;

providing a second pattern of parallel lines also adjacent to the polygon pattern, the parallel lines of the second pattern having a second pitch, the parallel lines of the second pattern having a same second line length wherein the length of the parallel lines of the second pattern determines a known width of the second pattern;

capturing a scattering pattern from the first pattern and a scattering pattern from the second pattern; and comparing the scattering pattern from the first pattern to the scattering pattern from the second pattern to estimate an optical aberration.

12. The method of claim 11 wherein the comparing is used in at least one of a group of processes including estimating overlay error, estimating optical aberrations, estimating aberrations in a scatterometry process, measuring overly errors, measuring optical aberrations, calibrating an optical photolithography measurement system, calibrating a semiconductor manufacturing system, registering overlay, registering optical aberrations, and monitoring aberrations of a lens in an optical photolithography system.

13. A photolithographic process, comprising:

providing a box-in-box polygon pattern;

providing a first pattern of parallel lines adjacent to the polygon pattern, the parallel lines of the first pattern having a first pitch, the parallel lines of the first pattern having a same first line length wherein the length of the parallel lines of the first pattern determines a known width of the first pattern;

providing a second pattern of parallel lines also adjacent to the polygon pattern, the parallel lines of the second pattern having a second pitch, the parallel lines of the second pattern having a same second line length wherein the length of the parallel lines of the second pattern determines a known width of the second pattern;

scanning the first pattern and the second pattern with a scanning electron microscope;

capturing an image of ejected electrons from the first pattern and the second pattern;

measuring a difference in width of the first pattern and the second pattern; and calculating an aberration from the difference in the width.

14. The method of claim 13 further including:

estimating a displacement of the box-in-box structure.

15. The method of claim 13 further including:

estimating a defocus aberration from the difference in the width of the first pattern and the second pattern.

16. The method of claim 13 further including:

estimating a coma aberration from the difference in the width of the first pattern and the second pattern.

17. The method of claim 13 further including:

estimating a spherical aberration from the difference in the width of the first pattern and the second pattern.

18. The method of claim 13 further including:

estimating an astigmatism aberration from the difference in the width of the first pattern and the second pattern.

19. The method of claim 13 further including:

mapping a lens for aberrations from the difference in the width of the first pattern and the second pattern.

20. A photolithographic process, comprising:

providing a first pattern of parallel lines adjacent to the polygon pattern, the parallel lines of the first pattern having a first pitch, the parallel lines of the first pattern having a same first line length wherein the length of the parallel lines of the first pattern determines a known width of the first pattern;

providing a second pattern of parallel lines also adjacent to the polygon pattern, the parallel lines of the second pattern having a second pitch, the parallel lines of the second pattern having a same second line length wherein the length of the parallel lines of the second pattern determines a known width of the second pattern;

illuminating the first pattern and the second pattern with light; and comparing the shifting of the first pattern relative to the second pattern to calculate an optical aberration.

21. The method of claim 20 wherein the optical aberration includes at least one of a defocus aberration, a coma aberration, a spherical aberration, a displacement aberration, and an astigmatism aberration.

* * * * *

UNITED STATES PATENT AND TRADEMARK OFFICE
CERTIFICATE OF CORRECTION

PATENT NO. : 7,463,367 B2  Page 1 of 1
APPLICATION NO. : 11/490890
DATED : December 9, 2008
INVENTOR(S) : Bowes It is certified that error appears in the above-identified patent and that said Letters Patent is hereby corrected as shown below:

In column 16, line 32, in Claim 4, delete "overly" and insert -- overlay --, therefor.

In column 17, line 34, in Claim 12, delete "overly" and insert -- overlay --, therefor.

Signed and Sealed this

Tenth Day of February, 2009

JOHN DOLL
*Acting Director of the United States Patent and Trademark Office*